United States Patent [19]

Swirbel

[11] Patent Number: 5,501,943
[45] Date of Patent: Mar. 26, 1996

[54] METHOD OF PATTERNING AN INORGANIC OVERCOAT FOR A LIQUID CRYSTAL DISPLAY ELECTRODE

[75] Inventor: Thomas J. Swirbel, Davie, Fla.

[73] Assignee: Motorola, Inc., Schaumburg, Ill.

[21] Appl. No.: 391,816

[22] Filed: Feb. 21, 1995

[51] Int. Cl.$^6$ ........................................................ B44C 1/22
[52] U.S. Cl. ........................... 430/313; 430/311; 430/317; 430/323; 430/20; 359/36
[58] Field of Search ..................................... 430/311, 313, 430/317, 319, 323, 20; 359/36, 74

[56] References Cited

U.S. PATENT DOCUMENTS 3,928,658  12/1975  van Bostel, et al. ................... 427/108
4,023,259   5/1977  Kubota et al. ............................ 29/592
4,865,649   9/1989  Kashiwagi .......................... 106/287.16
5,186,787   2/1993  Phillips ................................... 156/631

Primary Examiner—Kathleen Duda
Attorney, Agent, or Firm—Dale W. Dorinski

[57] ABSTRACT

A method of photodefining a hardcoat material to cover electrodes on a substrate. The substrate and the circuit pattern are coated (10) with a thin film of a tetramethoxy silane or tetraisopropoxy titanate hardcoat material. A positive photoresist is applied (30) over the thin film of hardcoat material and selectively exposed to actinic radiation(40). The photoresist is developed (50) to expose portions of the underlying hardcoat film, and the hardcoat film is etched (50) with an alkaline etchant solution to form a pattern. The etching and developing take place in the same step. The photoresist is then removed (60), and the patterned hardcoat material is baked (70).

10 Claims, 2 Drawing Sheets

METHOD OF PATTERNING AN INORGANIC OVERCOAT FOR A LIQUID CRYSTAL DISPLAY ELECTRODE

TECHNICAL FIELD

This invention relates in general to liquid crystal displays, and more particularly to a method of providing a coating on a liquid crystal display.

BACKGROUND

Liquid crystal displays (LCD) are increasing in popularity as they are integrated into more consumer products. The need exists to develop display technologies which are capable of displaying more information. Likewise, the need exists to develop the processing technologies to enable the efficient manufacture of such devices. Typical liquid crystal display construction uses two substrates with patterned electrodes separated by a gap of 5 to 10 microns into which the liquid crystal fluid is injected. In order to display more information, the LCD should have the thinnest possible gap. For example, fast switching super twisted nematic (STN) displays use 4 micron cell gaps and ferroelectric displays use a gap of less than 1 micron. When the voltage is applied across these small gaps, the electric field can be very large, causing an electric short if any foreign material such as dust is present in the gap. Additionally, this phenomena is also seen in devices such as cholesteric displays where much higher voltages of up to 50 volts may be placed across the electrodes. The LCD industry currently solves this problem by using inorganic coatings on top of the electrodes to act as an insulation layer between the plates. The coating is usually applied using offset printing techniques and then fired to cure it. Additionally it is also common to completely coat the substrate, cure the coating to harden it, and then etch the hardened coating in hydrofluoric acid through a patterned photoresist mask. While these methods produce patterned coatings, they require expensive hard tooling (printheads) and the use of corrosive chemicals (hydrofluoric acid) which can damage glass substrates. Obviously, it would be advantageous to have a method of providing an insulation layer over the electrode that does not require expensive tooling and does not harm the glass substrate.

DETAILED DESCRIPTION OF THE PREFERRED EMBODIMENT

Figure 1:
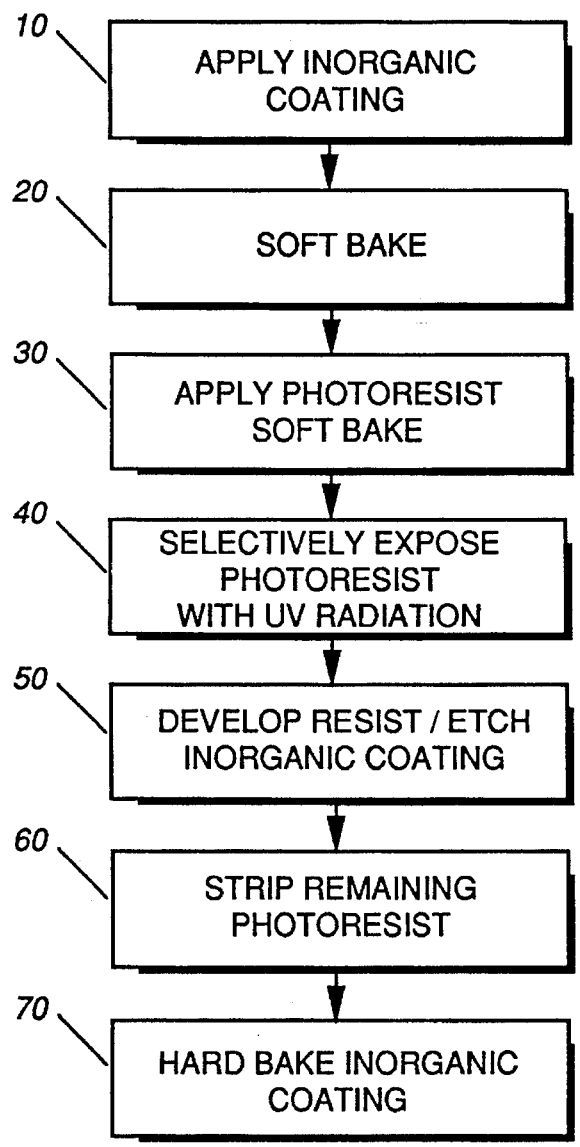
FIG. 1 is a process flow diagram of the preferred embodiment of the invention.

While the specification concludes with claims defining the features of the invention that are regarded as novel, it is believed that the invention will be better understood from a consideration of the following description in conjunction with the drawing figures. Referring now to the stepwise process flow diagram shown in FIG. 1, a substrate is coated (step 10) with a silicon or titanium-based solution such as tetramethoxy silane or tetraisopropoxy titanate. The solution is formed by dissolving the silane or titanate in a suitable solvent such as ethylene glycol or isopropyl alcohol, to achieve a solids content of between about 3–9% by weight, with 6% being preferred. Appropriate solutions of silanes or titanates are commercially available from sources such as Nissan Chemical. The substrate is coated with the solution by conventional means such as dipping the substrate into the solution or depositing a small amount of the solution onto the substrate while it is rapidly spinning, with the spinning method being preferred. The spin speed and times should be optimized to give a final coating thickness between 300 Å–, 10,000 Å, with 700 Å–1,000 Å the preferred thickness. When a material silane material such as Nissan Chemical NHC-AT744 is used, 7,000 RPM for 30 seconds yielded the best results. After coating, the material is dried, (step 20) in a convection oven at a time and temperature suitable to drive off any residual solvents that remain from the deposited solution. Times and temperatures between 60 minutes at 85° C. and 5 minutes at 185° C. have been found to be effective, with 125° C. for 30 minute being preferred. This type of drying step is commonly referred to as "soft-baking", because the goal of this step is to simply dry the coating without further reacting it. The deposited and dried coating is referred to as the "inorganic coating".

Upon completion of the "soft baking" step 20, a layer of photoresist is applied over the inorganic coating. The photoresist should be of a type which can be developed in an alkaline solution. One example of a suitable photoresist is AZ4620 manufactured by American Hoescht. This is a positive type resist that is typically applied by spin coating it onto the substrate surface. However, alternate materials are also effective, including negative-working dry film resists which are developed in aqueous carbonate solutions. After the photoresist is applied, it is dried (if necessary) to remove residual solvents and/or to improve adhesion of the resist to the underlying coating. The conditions used to dry the resist are dependent on the type of resist used, and would typically be those that are indicated by the photoresist manufacturer. In some cases, it may not be necessary to dry or bake the resist. Subsequently, the photoresist and underlying inorganic coating are selectively exposed in step 40 to actinic radiation such as ultraviolet (UV) light at a wavelength of about 360 nm. This type of exposure step is quite common in photoresist processing, and uses a mask which has portions of it blackened to prevent the UV light from passing through to corresponding portions of the resist surface. After exposure, the resist is developed (step 50) by immersing or spraying with an alkaline solution to remove those portions of the resist which were exposed to the UV light. This step exposes portions of the underlying inorganic coating, and also removes or etches away the exposed inorganic coating at the same time. The developing solution is an aqueous solution of borates, carbonates, or hydroxides, (e.g. borates, carbonates, or hydroxides of the Group IA and IIA metals such as lithium, sodium, potassium, magnesium, and calcium). A 1% solution of sodium borate has been found to work best when using developing conditions from 4 minutes at 25° C. to 1 minute at 45° C. This step of developing and selectively etching creates a pattern in the photoresist and the underlying inorganic coating that corresponds to the pattern in the mask. The inorganic coating is etched at essentially the same time as the photoresist is developed, since both occur in the same step. The resist layer is then removed or stripped (step 60) in an appropriate solution, rinsed and dried. In the case of the AZ 4620 photoresist, the solution consists of a blend of butyl acetate and isopropyl alcohol, but the exact content of the stripping solution employed will vary as a function of the type of photoresist that is used. Specific materials used to strip the resist may best be chosen by consulting the manufacturer of the photoresist. After stripping, the coating is baked (step 70) to harden the patterned inorganic coating layer. Typical baking conditions of 1–2 hours at 250° C.–400° C. were found to work well. The resulting patterned coating is a hardened silicon or titanium based film which is typically known as a substrate overcoat or electrode hardcoat film.

Figure 2:
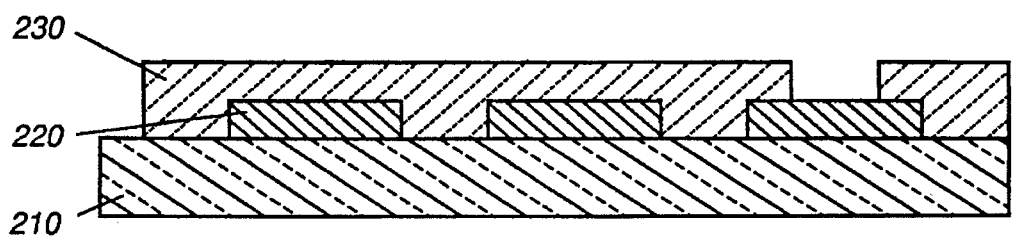
FIG. 2 is a partial cross-sectional view of a substrate prepared in accordance with the process of the invention.

To better understand the process flow, a cross-section of a substrate manufactured in accordance with above process is shown in FIG. 2. The drawing is purposely not drawn to scale in order to better illustrate the various features of the invention. The substrate 210 may be a glass, ceramic or semiconductor and typically has an electrode pattern 220 defined on its surface. The electrode pattern 220 may consist of metals, metal oxides, semiconductors, or insulators, all of which are well known to those skilled in the art. The preferred embodiment is a glass substrate with indium-tin oxide electrodes. The patterned inorganic hardcoat material 230 selectively covers the electrode pattern and the underlying substrate.

Figure 3:
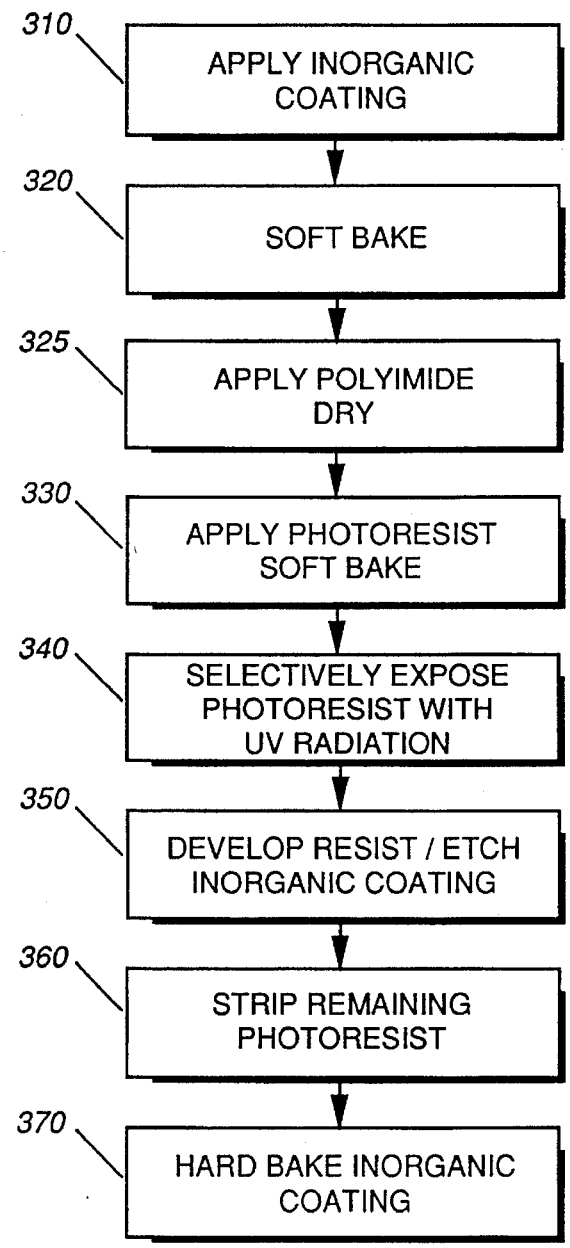
FIG. 3 is a process flow diagram of an alternate embodiment of the invention.

An alternate embodiment of this process is outlined in FIG. 3. As described previously, a substrate is coated (step 310) with an inorganic coating, typically a silicon or titanium-based solution such as tetramethoxy silane or tetraisopropoxy titanate and subsequently soft baked in step 320. A second coating of an organic dielectric material is then applied over the inorganic coating 325. The second coating, in this embodiment, is a polyimide (for example, DuPont 2555, a liquid polyimide solution manufactured by the E.I. DuPont deNemours Co. of Wilmington Del.) applied by spin coating the polyimide solution to achieve a finished polyimide thickness of about 500–1500 Å, however, other dielectric materials which are alkaline etchable could be applied. The second coating is then dried and/or soft baked. A photoresist such as AZ4620 is then applied in step 330 over the two previously applied coatings (the inorganic coating and the polyimide coating) in a manner similar to that described in the preferred embodiment. Portions of the photoresist are then exposed to UV radiation through a suitable mask (step 340). With the exception of step 325, these steps are all similar to those outlined in the process described in FIG. 1. After exposure, the coated substrate is immersed or sprayed in an alkaline solution of borates or hydroxides to develop the resist by dissolving the exposed resist. However, the addition of the polyimide coating now requires that the polyimide also be selectively removed in order to selectively etch the underlying inorganic coating. Since the polyimide can be dissolved in an alkaline solution, the use of the alkaline etch solution as a developer facilitates the selective removal of portions of the polyimide coating. The removal process found to work best for this embodiment was to spray the surface with 1% solution by weight of sodium borate at 45° C. for 1 minute. Once the image is formed or developed, the resist layer is removed (step 360) in a solution of butyl acetate and isopropyl alcohol, rinsed and dried. Subsequently, the patterned multilayer coating is baked at 250° C.–350° C. for 1–2 hours to remove residual solvents, the harden the inorganic coating and to further cure the polyimide layer. After baking, the resulting polyimide and inorganic coating layers provide excellent protection for the underlying substrate and for an electrode pattern which may be resident on the substrate surface. Additionally, when the substrate is used in a device such as a liquid crystal display, the multilayer coating will not only provide protection, but the polyimide also serve as the alignment layer for the liquid crystal fluid.

Figure 4:
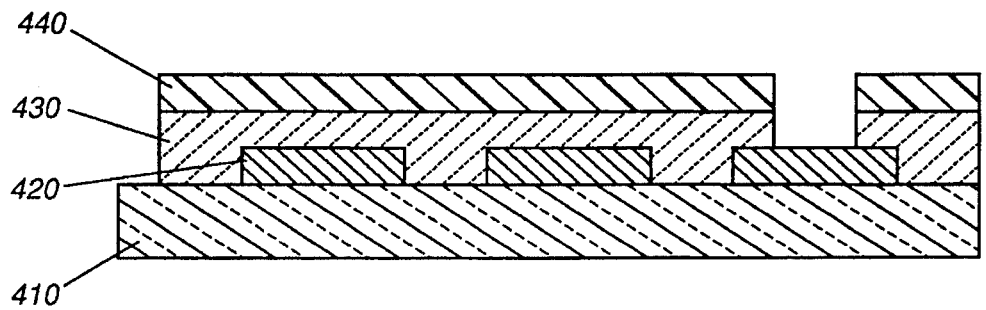
FIG. 4 is a partial cross-sectional view of a substrate prepared in accordance with the alternate embodiment of the invention as outlined in FIG. 3.

A cross-section of a substrate manufactured in accordance with above process is shown in FIG. 4. The drawing is also drawn to an exaggerated scale in order to better illustrate the various features of the invention. The substrate 410 has an electrode pattern 420 defined on its surface. The electrode pattern 420 may consist of metals, metal oxides, semiconductors or insulators, all of which are well known to those skilled in the art. One embodiment is a glass substrate with indium-tin oxide electrodes. The patterned inorganic hardcoat material 430 selectively covers the electrode pattern and the underlying substrate. An overlayer of polyimide 440 covers the inorganic hardcoat material 430.

In summary, the instant invention provides a unique method of selectively coating the metal electrodes in a liquid crystal display using photolithography. The need for dedicated hard tooling such as print heads and stencils is eliminated, as are hazardous and corrosive chemicals such as hydrofluoric acid. Environmentally friendly materials such as carbonates or borates are used to develop the photoresist and etch the inorganic coating in a single step prior to fully curing the inorganic coating. Further, a polyimide coating can also be patterned in the same step if desired. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of photodefining a hardcoat material, comprising:

providing a substrate having a major surface;

coating the major surface with a thin film of an uncured hardcoat material;

applying a photoresist layer over the uncured hardcoat material;

providing a pattern in the photoresist layer to selectively reveal portions of the uncured hardcoat material;

providing a pattern in the uncured hardcoat material by etching the revealed portions with an alkaline solution, said pattern corresponding to the pattern in the photoresist layer;

removing the photoresist layer; and heating the substrate to cure the uncured hardcoat material.

2. The method as described in claim 1, wherein the step of providing a pattern in the photoresist layer comprises selectively exposing portions of the photoresist to actinic radiation.

3. The method as described in claim 2, wherein the step of providing a pattern in the photoresist layer further comprises developing the photoresist layer in an alkaline solution.

4. The method as described in claim 3, wherein the step of providing a pattern in the photoresist layer and the step of providing a pattern in the uncured hardcoat material are combined into a single step.

5. The method as described in claim 1, further comprising a step of applying a layer of polyimide over the uncured hardcoat material after the step of coating and before the step of applying a photoresist layer, and wherein the step of providing a pattern in the photoresist layer further comprises etching portions of the layer of polyimide.

6. The method as described in claim 5, wherein the step of providing a pattern in the photoresist layer and the step of providing a pattern in the uncured hardcoat material are combined into a single step.

7. A method of patterning an inorganic overcoat for a liquid crystal display, comprising the following steps in the order named:

A) providing a glass substrate having an electrically conductive circuit pattern on a major surface;

B) coating the glass substrate major surface and the electrically conductive circuit pattern with a thin film of an inorganic overcoat material selected from the group consisting of tetramethoxy silane, tetraisopropoxy titanate and combinations thereof;

C) applying a positive photoresist over the inorganic overcoat material;

D) selectively exposing portions of the positive photoresist to actinic radiation;

E) developing the positive photoresist and etching the underlying inorganic overcoat material is a single step using an alkaline etchant solution, so that a pattern is created in the inorganic covercoat to reveal portions of the glass substrate;

F) removing the positive photoresist; and

G) heating the etched inorganic overcoat material to fully cure it.

8. The method as described in claim 7, wherein the electrically conductive circuit pattern comprises indium-tin oxide.

9. The method as described in claim 7, wherein step (E) comprises developing and etching in an aqueous solution of one or more chemicals selected from the group consisting of sodium borate, sodium carbonate, sodium hydroxide, potassium borate, potassium carbonate, and potassium hydroxide.

10. The method as described in claim 7, further comprising a step of applying a layer of polyimide over the inorganic overcoat material after step (B) and before step (C), and wherein step (E) further comprises etching portions of the layer of polyimide.

* * * * *